(12) United States Patent
Fischer et al.

(10) Patent No.: US 6,791,906 B1
(45) Date of Patent: Sep. 14, 2004

(54) METHOD AND SYSTEM FOR FAIL-SAFE CONTROL OF A FREQUENCY SYNTHESIZER

(75) Inventors: Timothy C. Fischer, Berthoud, CO (US); Samuel D. Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/699,546

(22) Filed: Oct. 30, 2003

(51) Int. Cl.[7] .................. G04C 15/00; H03L 7/085; H03L 7/18

(52) U.S. Cl. .................. 368/155; 331/11; 331/15; 331/25; 331/27

(58) Field of Search .................. 368/155–156; 331/11, 17, 25–28

(56) References Cited

U.S. PATENT DOCUMENTS 5,332,978 A * 7/1994 Yabuki et al. .................. 331/2
5,448,193 A * 9/1995 Baumert et al. .................. 327/156
5,856,761 A * 1/1999 Jokura .................. 331/11
6,198,353 B1 * 3/2001 Janesch et al. .................. 331/16

* cited by examiner

*Primary Examiner*—Vit W. Miska
(74) *Attorney, Agent, or Firm*—John Pessetto

(57) ABSTRACT

In a preferred embodiment, the invention provides a method and system for allowing a frequency synthesizer to function despite long delays. A first and second phase comparator, each with at least three inputs and an output are preset to a predetermined logical value by a first control circuit. A first signal is connected to an input of the first and second phase comparators. A second signal is connected to a second input of the second phase comparator and to the input of a programmable dead zone delay circuit. The output of the programmable dead zone delay circuit is connected to a second input of the first phase comparator. A preset value, determined by the first control circuit, is presented on the outputs of the first and second phase comparators. Until metastability is resolved, these outputs retain a valid fail-safe default.

12 Claims, 4 Drawing Sheets

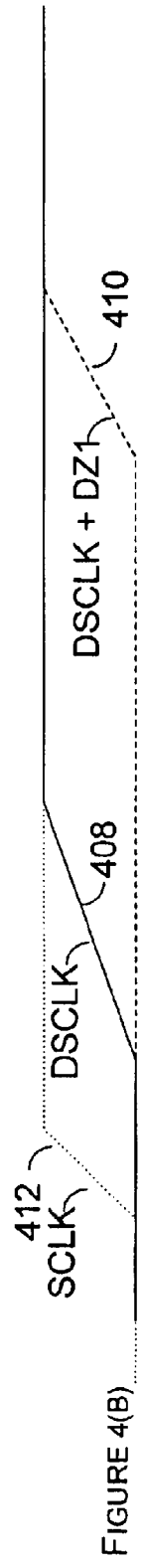

METHOD AND SYSTEM FOR FAIL-SAFE CONTROL OF A FREQUENCY SYNTHESIZER

FIELD OF THE INVENTION

This invention relates generally to clocking circuits on integrated circuits (ICs). More particularly, this invention relates to improving clock frequencies on ICs.

BACKGROUND OF THE INVENTION

A microprocessor, an example of an IC, used in many large computer systems may include memory elements, combinational logic, and a clocking system. The memory elements may be arranged in sets, sometimes called registers that may correspond to the word size used in a computer system. Between at least some sets of memory elements are combinational logic circuits. At the end of a clock cycle, which is also the beginning of the next clock cycle, data on the output of the combinational logic circuitry is stored in a first set of memory elements. This data appears on the output of the set of memory elements, and therefore on the input of other combinational logic circuitry. The other logic circuitry performs the designed logic function on the data, and at the end of the clock cycle the output of this combinational logic is stored in a next set of memory elements. This process is repeated as the computer operates. In other words, data is processed by combinational logic circuitry, stored in memory elements, and then passed on to other combinational logic circuitry. A system clock, often a PLL (Phase Locked Loop) controls the clocking of information from one state to the next state.

Typically, the period of the system clock can not be shorter than the delay time of the slowest logic path from one memory element to another memory element. When a chip is designed, simulations often give a good estimate of the slowest logic path. However, when a microprocessor, for example, is fabricated, the slowest logic path may be one other than a logic path identified by simulation. In addition, the slowest logic path may be faster or slower than anticipated by simulation.

If the slowest path is faster than anticipated by simulation, the frequency of the system clock may be increased from the original design frequency. If the slowest path is slower than anticipated by simulation, the frequency of the system clock should be decreased or errors will occur.

In order to obtain the maximum system clock frequency for a particular IC, the input of a programmable delay line that approximates the delay of the slowest path on the IC is connected to the system clock. An edge of the output of the programmable delay line is compared to an edge of the system clock by a comparator. The comparator sends a signal to a frequency synthesizer to increase the frequency of the system clock if the edge of the delay line output arrives considerably before the system clock. The comparator sends a signal to a frequency synthesizer to decrease the frequency of the system clock if the edge of the delay line output arrives considerably after the system clock.

The comparator has a programmable dead zone delay circuit centered in time around the system clock. If an edge of the output of the programmable delay line output falls within the dead zone (DZ), the comparator sends a signal to a frequency synthesizer to leave the period of the system clock near its present value.

Metastability occurs in a comparator when an edge of the output of the programmable delay line output arrives near an edge of the dead zone. As a result, a comparator may create a relatively long delay before sending a signal to either increase the period of the clock, decrease the period of the clock, or leave the period of the clock near where it is presently. As a result, the frequency synthesizer doesn't control the system clock period until this delay is ended. If the delay is too long, the frequency synthesizer will fail in an unrecoverable manner.

Other delays may cause the frequency synthesizer to fail in an unrecoverable manner. For example, route delay may be long enough to cause the frequency synthesizer to fail without recovery. A programmable delay line may also create a delay that is long enough to cause the frequency synthesizer to fail without recovery. For example, if the voltage supplied to the programmable delay line is low enough, the delay created by the programmable delay could be long enough to cause the frequency synthesizer to fail without recovery.

There is a need in the art to eliminate the delay times that can cause a frequency synthesizer to fail. An embodiment of this invention provides a fail-safe system that eliminates any delays long enough to cause the frequency synthesizer to fail without recovery.

SUMMARY OF THE INVENTION

In a preferred embodiment, the invention provides a method and system for allowing a frequency synthesizer to function despite long delays. A first phase comparator with at least three inputs and an output is preset to a predetermined logical value by a first control circuit. A second phase comparator with at least three inputs and an output is preset to a predetermined logical value by the first control circuit. A first signal is connected to an input of the first and second phase comparators. A second signal is connected to a second input of the second phase comparator and to the input of a programmable dead zone delay circuit. The output of the programmable dead zone delay circuit is connected to a second input of the first phase comparator. A preset value, determined by the first control circuit, is presented on the outputs of the first and second phase comparators. Until metastability is resolved, these outputs retain a valid fail-safe default.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 4(A) is a timing diagram used with FIG. 3.
FIG. 4(B) is a timing diagram used with FIG. 3.
FIG. 4(C) is a timing diagram used with FIG. 3.
FIG. 4(D) is a timing diagram used with FIG. 3.

DETAILED DESCRIPTION OF THE PREFERRED EMBODIMENT

Figure 1:
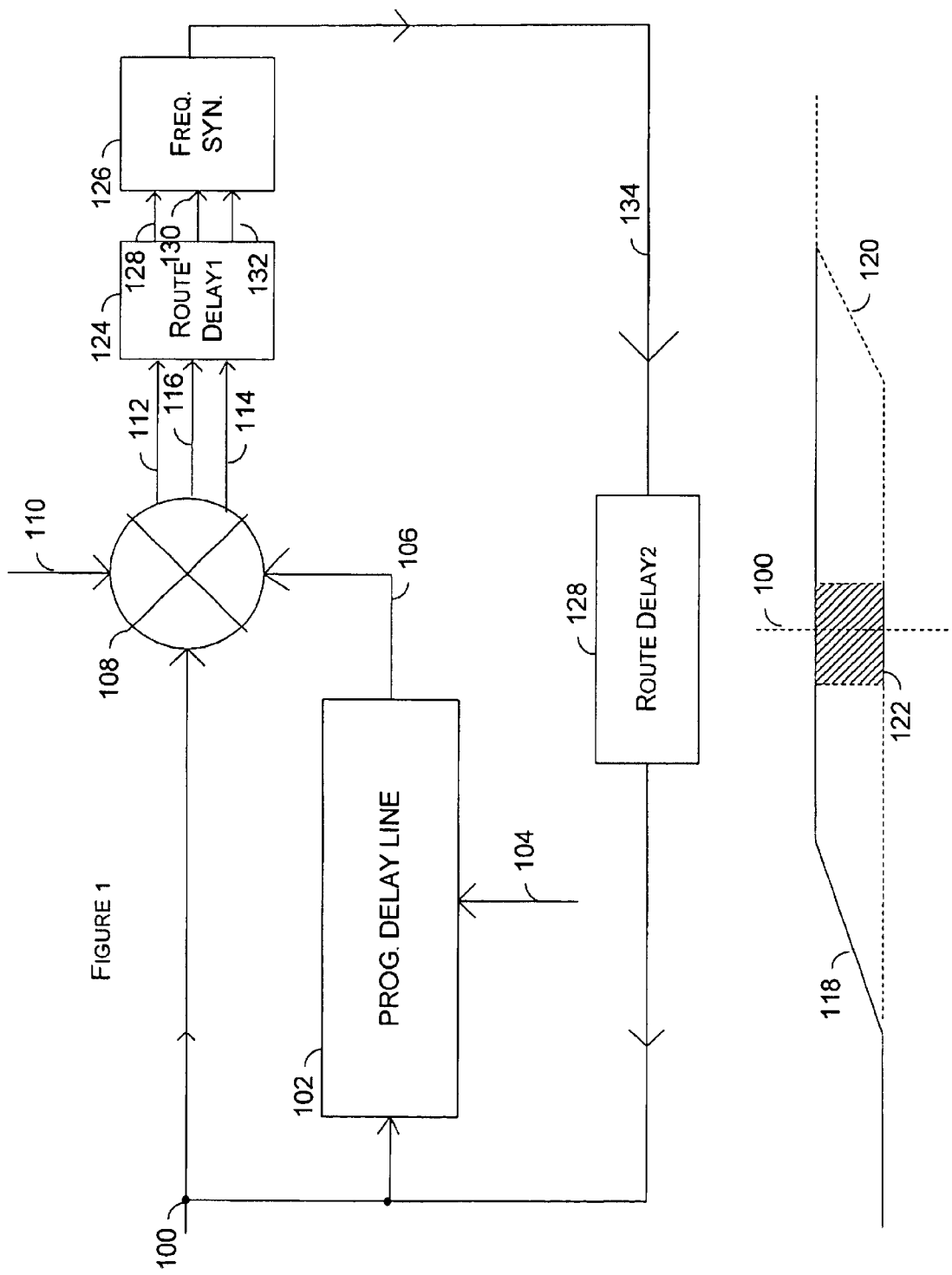
FIG. 1 is a schematic drawing of a programmable delay line, a programmable comparator, a first route delay, a second delay, a frequency synthesizer, and a timing diagram.

FIG. 1 is a schematic drawing of a programmable delay line, a programmable comparator, a first route delay, a second route delay, a frequency synthesizer, and a timing diagram. A system clock, 100, is fed into the input of a programmable delay line, 102 and an input of a programmable comparator, 108. The programmable delay line is programmed, 104, to a time delay approximately the same as the delay of the slowest data path.

An edge of the output, 106, of the programmable delay line, 102, is compared to an edge of the system clock, 100. If the edge of the output, 106, of the programmable delay line, 102, occurs earlier in time, 118, than the edge of the system clock, 100, the comparator outputs a signal, 112, that indicates to a frequency synthesizer the system clock, 100, frequency should be increased. If the edge of the output, 106, of the programmable delay line, 102, occurs later in time, 120, than the edge of the system clock, 100, the comparator outputs a signal, 114, that indicates to a frequency synthesizer the system clock, 100, frequency should be decreased.

An edge of the output, 106, of the programmable delay line, 102, is compared to an edge of the system clock, 100. If the edge of the output, 106, of the programmable delay line, 102, falls within the dead zone, 122, the comparator outputs a signal, 116, that indicates the frequency, 100, should not change.

Metastability may occur when the signal, 106, falls relatively close to an edge of the dead zone, 122. When metastability occurs, it may take a relatively long time for the comparator to output a signal, 112, 114, or 116. A frequency synthesizer, 126, that controls the system clock, 100, typically has to wait for one of these signals to assert. During this time, the system clock, 100, is typically not controlled by the frequency synthesizer, 126.

An embodiment of the invention allows the frequency synthesizer, 126, to operate even after long delays. For example, if the programmable comparator, 108, due to metastability, creates a delay long delay, the frequency synthesizer, 126 will continue to generate a system clock, 100. If a long delay is created by route delay1, 124, the frequency synthesizer, 126 will continue to generate a system clock, 100. If a long delay is created by route delay2, 128, the frequency synthesizer, 126 will continue to generate a system clock, 100. Finally, if a long delay is created by a low voltage on the programmable delay line, 102, the frequency synthesizer, 126 will continue to generate a system clock, 100.

Figure 2:
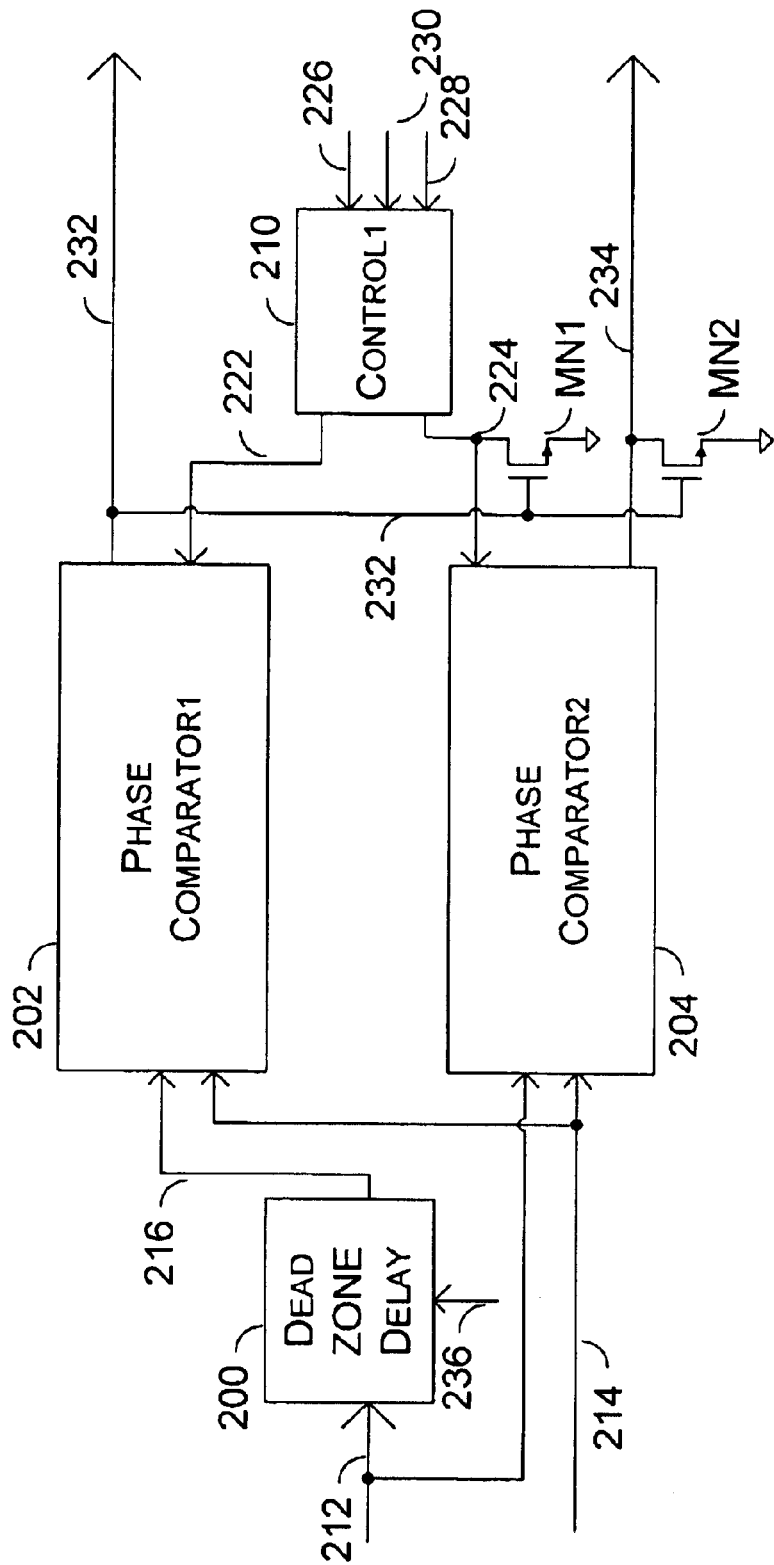
FIG. 2 is a block diagram of a programmable comparator for eliminating delays that cause a frequency synthesizer to fail without recovery.

FIG. 2 is a block diagram of a programmable comparator for eliminating delays that cause a frequency synthesizer to fail without recovery. The first control circuit, 210, after receiving a signal from line 226, 228, or 230, presets a value on an input, 222 of the first phase comparator, 202, and on an input, 224, of the second phase comparator, 204. After the inputs, 222 and 224, are preset on the first, 202, and second, 204, phase comparators respectively, a logic value is set on the output, 232, of the first phase comparator, 202, and on the output, 234, of the second phase comparator, 204. These values, 232 and 234, are maintained until the inputs, 212, 214, and 216, of the first phase comparator, 202, and the second phase comparator, 204, respectively are resolved.

A signal 214, for example a system clock, is connected to an input of the first phase comparator, 202, and an input of the second phase comparator, 204. A signal 212, for example a delayed system clock, is connected to an input of the second phase comparator, 204, and to the input of a programmable dead zone delay circuit, 200. The width in time of the dead zone delay is controlled by signal 236. The output, 216, of the programmable dead zone delay circuit, 200, is connected to an input of phase comparator, 202.

In this example, if an edge of signal 212 arrives before an edge of signal 214 and outside the deadzone, the output, 234, of the second phase comparator, 204, briefly goes high and the output, 232, of the first phase comparator, 202 also goes high. After output 232, goes high, NFET, MN2, pulls output 234, low and NFET, MN1, pulls node 224 low. In this example, if output, 232, goes high, it indicates to a frequency synthesizer to increase the frequency of the system clock.

In another example, if an edge of signal 212 arrives after an edge of signal 214 and outside the deadzone, the output, 234, of the second phase comparator, 204, retains its logical low value and the output, 232, of the first phase comparator, 202, retains its logical low value. In this example, if outputs, 232 and 234, retain their logical low values, it indicates to a frequency synthesizer to decrease the frequency of the system clock.

In another example, if an edge of signal 212 arrives in the deadzone, the output, 234, of the second phase comparator, 204, goes to a logical high value and the output, 232, of the first phase comparator, 202, retains its logical low value. In this example, if output, 232, retains its logical low value, and output, 234, goes to a logical high value, it indicates to a frequency synthesizer to not change the frequency of the system clock.

In the case where an edge of signal 212 is close to an edge of the deadzone, it may take a relatively long time to resolve the inputs 212, 214, and 216. During the time required to resolve inputs 220 and 218, the outputs, 232 and 234, retain their precharge values. Until metastability is resolved, outputs 232 and 234 retain a valid fail-safe default.

Figure 3:
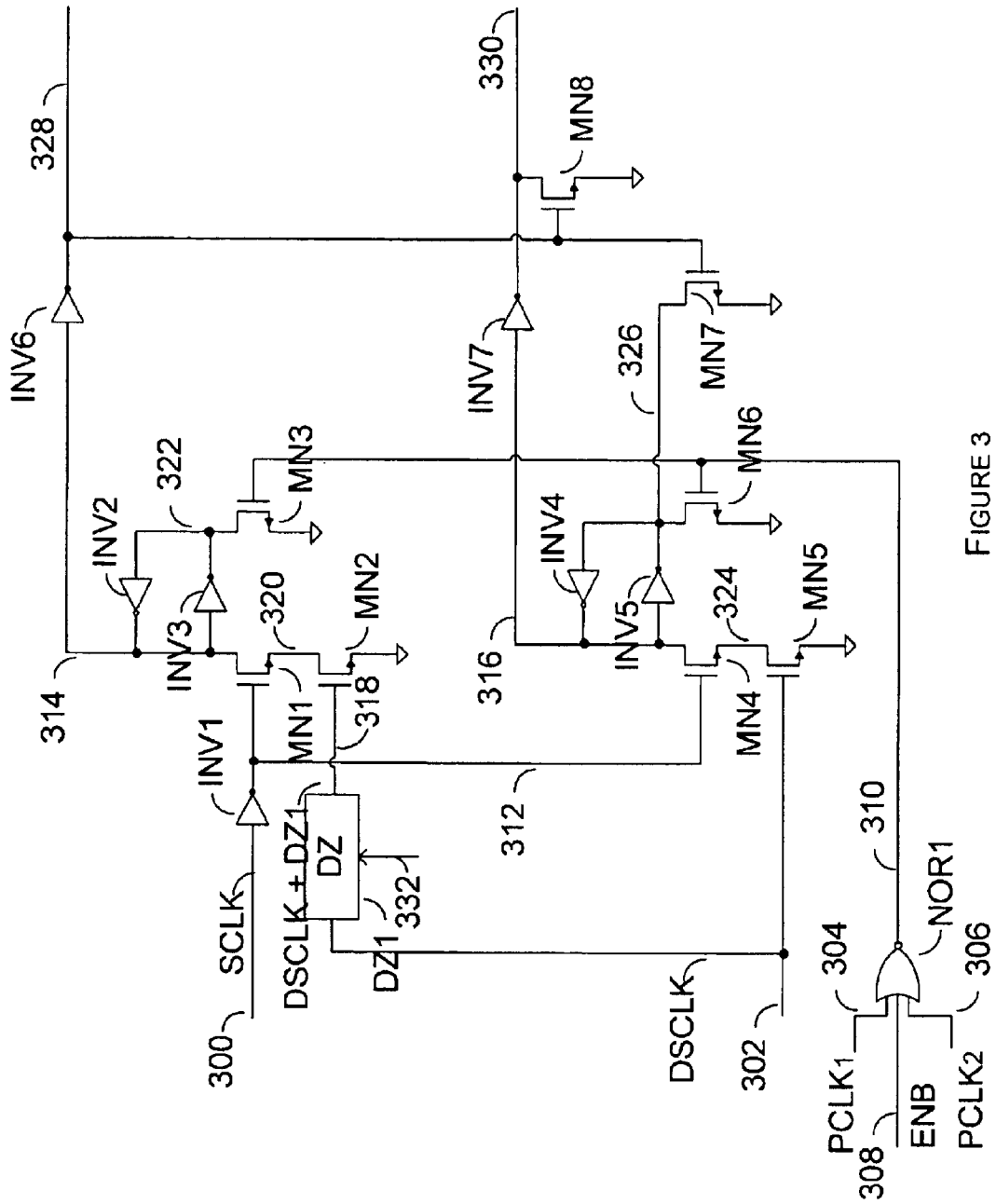
FIG. 3 is a schematic drawing of a programmable comparator for eliminating delays that cause a frequency synthesizer to fail without recovery.

FIG. 3 is a schematic drawing of a programmable comparator for eliminating delays that cause a frequency synthesizer to fail without recovery. Signal 300, system clock, SCLK, is connected to the input of the inverter, INV1. Signal, 302, delayed system clock, DSCLK, is connected to the input of the programmable dead zone delay circuit, DZ1, and to the gate of NFET, MN5. The output, 312, of inverter, INV1, is connected to the gate of NFET, MN4 and to the gate of NFET, MN1. The drain, 324 of NFET, MN5, is connected to the source, 324 of NFET, MN4. The output, 318, of the programmable dead zone delay circuit, DZ1, is connected to the gate of NFET, MN2. The drain, 320, of NFET, MN2, is connected to the source, 320, of NFET, MN1. The sources of NFETs, MN5 and MN2 are connected GND.

The three inputs to NOR1 are PCLK1, ENB, and PCLK2. The output, 310, of NOR1, is connected to the gate of MN6 and to the gate of MN3. The drain, 314, of NFET, MN1, is connected to the input of inverter, INV3, the output of inverter INV2, and the input of inverter, INV6. The drain, 322, of MN3, is connected to the output of inverter, INV3, and the input of inverter INV2. The drain, 316, of NFET, MN4, is connected to the input of inverter, INV5, the output of inverter INV4, and the input of inverter, INV7. The drain, 326, of MN6, is connected to the output of inverter, INV5, the input of inverter INV2, and the drain of NFET, MN7. The gates, 328, of NFETs, MN7 and MN8, are connected to the output of inverter, INV6. The source of NFETs, MN7 and MN8, are connected GND. The drain of NFET MN8, is connected to the output 330, of inverter, INV7. Node 332 controls the delay of the dead zone delay circuit, DZ1.

FIG. 4(A) is a timing diagram that may be used with FIG. 3. The time delay between DSCLK, 402, and DSCLK+DZ1, 404, shows the time delay due to the programmable dead zone delay circuit, DZ1, in FIG. 3. When the system clock, SCLK, 406, follows the dead zone in time, output 330, is changed briefly from a precharged logical low value to a logic high value. When the system clock, SCLK, 406, follows the dead zone in time, output 328, is changed from a precharged logical low value to a logic high value. After output, 328, goes high, NFET, MN8, pulls output, 330, to a low value and NFET, MN7, pulls node 326 to a low value. When output, 328 is high, it signals a frequency synthesizer to increase the frequency of the system clock.

FIG. 4(B) is a timing diagram that may be used with FIG. 3. The time delay between DSCLK, 408, and DSCLK +DZ1, 410, shows the time delay due to the programmable dead zone delay circuit, DZ1, in FIG. 3. When the system clock, SCLK, 406, leads the dead zone in time, the outputs 328 and 330 don't change from their precharged logical low values. When the outputs 328 and 330 don't change from their precharged logical low values, they signal a frequency synthesizer to decrease the frequency of the system clock.

FIG. 4(C) is a timing diagram that may be used with FIG. 3. The time delay between DSCLK, 414, and DSCLK +DZ1, 416, shows the time delay due to the programmable dead zone delay circuit, DZ1, in FIG. 3. When the system clock, SCLK, 418, changes in the dead zone, output 330, is changed from a precharged logical low value to a logic high value. When the system clock, SCLK, 406, changes in the dead zone, output 328, retains its precharged logical low value. When output, 330, is high, and output, 328 is low, they signal a frequency synthesizer to not change the frequency of the system clock.

FIG. 4(D) is a timing diagram that may be used with FIG. 3. The time delay between DSCLK, 420, and DSCLK+DZ1, 422, shows the time delay due to the programmable dead zone delay circuit, DZ1, in FIG. 3. When the system clock, SCLK, 424, changes relatively close to the dead zone, it may take a relatively long time to resolve the inputs. Because outputs, 328 and 330, are precharged to default values, stable output signals, 328 and 330 are sent to a frequency synthesizer while the inputs, for example, SCLK and DSCLK, are resolved. Until metastability is resolved, outputs 328 and 330 retain a valid fail-safe default.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A programmable comparator for allowing a frequency synthesizer to function despite long delays comprising:
   a) a first phase comparator, the first phase comparator having a first input, a second input, a third input, and an output;
   b) a second phase comparator, the second comparator having a first input, a second input, a third input, and an output;
   c) a programmable dead zone delay circuit, the programmable dead zone delay circuit having at least a control input, a data input and a data output;
   d) a first control circuit, the first control circuit having at least a first input, a second input, a third input, a first output and a second output;
   e) a first NFET, the first NFET having a gate, drain, and a source;
   f) a second NFET, the second NFET having a gate, drain, and a source;
   g) wherein the third input of the first phase comparator is driven to a predetermined logical value by the first output of the first control circuit;
   h) wherein the third input of the second phase comparator is driven to a predetermined logical value by the second output of the first control circuit;
   i) wherein a first signal is applied to the first input of the first phase comparator and the first input of the second phase comparator;
   j) wherein a second signal is applied to the data input of the programmable dead zone delay circuit and the second input of the second phase comparator;
   k) wherein the output of the programmable dead zone delay circuit is connected to the second input of the first phase comparator;
   l) wherein the first control input of the programmable dead zone delay circuit controls the time delay of the programmable dead zone delay circuit;
   m) wherein the output of the first phase comparator is connected to the gates of the first and second NFETs;
   n) wherein the drain of the first NFET is connected to the output of the second phase comparator;
   o) wherein the drain of the second NFET is connected to the third input of the second phase comparator;
   p) wherein the sources of the first and second NFETs are connected GND.

2. The circuit as in claim 1 wherein the first signal is a system clock and the second signal is a delayed system clock.

3. The circuit as in claim 2 wherein the first phase comparator comprises:
   a) a first inverter, the first inverter having an input and an output;
   b) a second inverter, the second inverter having an input and output;
   c) a third inverter, the third inverter having an input and output;
   d) a fourth inverter, the fourth inverter having an input and output;
   e) a third NFET, the third NFET having a gate, source, and drain;
   f) a fourth NFET, the fourth NFET having a gate, source, and drain;
   g) wherein the output of the first inverter is connected to the gate of the third NFET;
   h) wherein the source of the third NFET is connected to the drain of he fourth NFET;
   i) wherein the source of the fourth NFET is connected to GND;
   j) wherein the input of the first inverter is the first input of the first phase comparator;
   k) wherein the gate of the fourth NFET is the second input of the first phase comparator;
   l) wherein the input of the second inverter is connected to the output of the third inverter, the input of the fourth inverter, and the drain of the second NFET;
   m) wherein the output of the second inverter is the third input of the first phase comparator;
   n) wherein the output of the fourth inverter is the output of the first phase comparator.

4. The circuit as in claim 3 wherein the second phase comparator comprises:
a) a fifth inverter, the fifth inverter having an input and output;
b) a sixth inverter, the sixth inverter having a input and output;
c) a seventh inverter, the seventh inverter having a input and output;
d) a eight inverter, the eight inverter having a input and output;
e) a fifth NFET, the fififth NFET having a gate, source, and drain;
f) a sixth NFET, the sixth NFET having a gate, source, and drain;
g) wherein the output of the fifth inverter is connected to the gate of the fifth NFET;
h) wherein the source of the fifth NFET is connected to the drain of he sixth NFET;
i) wherein the source of the sixth NFET is connected to GND;
j) wherein the input of the fifth inverter is the first input of the second phase comparator;
k) wherein the gate of the sixth NFET is the second input of the second phase comparator;
l) wherein the input of the sixth inverter is connected to the output of the seventh inverter, the input of the eight inverter, and the drain of the fifth NFET;
m) wherein the output of the sixth inverter is the third input of the second phase comparator;
n) wherein the output of the eighth inverter is the output of the second phase comparator.

5. The circuit as in claim 4 wherein the programmable dead zone delay circuit comprises a programmable delay line.

6. A circuit as in claim 5 wherein the first control circuit comprises:
a) an NOR logic gate, the NOR logic gate having a set of inputs, and an output;
b) a seventh NFET, the seventh NFET having a gate, source, and drain;
c) a eighth NFET, the eighth NFET having a gate, source, and drain;
d) wherein the output of the NOR logic gate is connected to the gate of the seventh NFET and the gate of the eighth NFET;
e) wherein the source of the seventh NFET and the source of the eighth NFET are connected to GND;
f) wherein the set of inputs of the NOR logic gate is the input to the first control circuit;
g) wherein the drain of the seventh NFET is the first output of the first control circuit;
h) wherein the drain of the eighth NFET is the second output of the first control circuit.

7. A method of manufacturing a programmable comparator for allowing a frequency synthesizer to function despite long delays comprising:
a) fabricating a first phase comparator, the first phase comparator having a first input, a second input, a third input, and an output;
b) fabricating a second phase comparator, the second comparator having a first input, a second input, a third input, and an output;
c) fabricating a programmable dead zone delay circuit, the programmable dead zone delay circuit having at least a control input, a data input and a data output;
d) fabricating a first control circuit, the first control circuit having at least a first input, a second input, a third input, a first output and a second output;
e) fabricating a first NFET, the first NFET having a gate, drain, and a source;
f) fabricating a second NFET, the second NFET having a gate, drain, and a source;
g) wherein the third input of the first phase comparator is driven to a predetermined logical value by the first output of the first control circuit;
h) wherein the third input of the second phase comparator is driven to a predetermined logical value by the second output of the first control circuit;
i) wherein a first signal is applied to the first input of the first phase comparator and the first input of the second phase comparator;
j) wherein a second signal is applied to the data input of the programmable dead zone delay circuit and the second input of the second phase comparator;
k) wherein the output of the programmable dead zone delay circuit is connected to the second input of the first phase comparator;
l) wherein the first control input of the programmable dead zone delay circuit controls the time delay of the programmable dead zone delay circuit;
m) wherein the output of the first phase comparator is connected to the gates of the first and second NFETs;
n) wherein the drain of the first NFET is connected to the output of the second phase comparator;
o) wherein the drain of the second NFET is connected to the third input of the second phase comparator;
p) wherein the sources of the first and second NFETs are connected GND.

8. The method as in claim 7 wherein the first signal is a system clock and the second signal is a delayed system clock.

9. The method as in claim 8 wherein the first phase comparator comprises:
a) a first inverter, the first inverter having an input and an output;
b) a second inverter, the second inverter having an input and output;
c) a third inverter, the third inverter having an input and output;
d) a fourth inverter, the fourth inverter having an input and output;
e) a third NFET, the third NFET having a gate, source, and drain;
f) a fourth NFET, the fourth NFET having a gate, source, and drain;
g) wherein the output of the first inverter is connected to the gate of the third NFET;
h) wherein the source of the third NFET is connected to the drain of he fourth NFET;
i) wherein the source of the fourth NFET is connected to GND;
j) wherein the input of the first inverter is the first input of the first phase comparator;
k) wherein the gate of the fourth NFET is the second input of the first phase comparator;
l) wherein the input of the second inverter is connected to the output of the third inverter, the input of the fourth inverter, and the drain of the second NFET;

m) wherein the output of the second inverter is the third input of the first phase comparator;

n) wherein the output of the fourth inverter is the output of the first phase comparator.

10. The circuit as in claim 9 wherein the second phase comparator comprises:

a) a fifth inverter, the fifth inverter having an input and output;

b) a sixth inverter, the sixth inverter having a input and output;

c) a seventh inverter, the seventh inverter having a input and output;

d) a eight inverter, the eight inverter having a input and output;

e) a fifth NFET, the fifth NFET having a gate, source, and drain;

f) a sixth NFET, the sixth NFET having a gate, source, and drain;

g) wherein the output of the fifth inverter is connected to the gate of the fifth NFET;

h) wherein the source of the fifth NFET is connected to the drain of he sixth NFET;

i) wherein the source of the sixth NFET is connected to GND;

j) wherein the input of the fifth inverter is the first input of the second phase comparator;

k) wherein the gate of the sixth NFET is the second input of the second phase comparator;

l) wherein the input of the sixth inverter is connected to the output of the seventh inverter, the input of the eight inverter, and the drain of the fifth NFET;

m) wherein the output of the sixth inverter is the third input of the second phase comparator;

n) wherein the output of the eighth inverter is the output of the second phase comparator.

11. The method as in claim 10 wherein the programmable dead zone delay circuit comprises a programmable delay line.

12. A method as in claim 11 wherein the first control circuit comprises:

a) an NOR logic gate, the NOR logic gate having a set of inputs, and an output;

b) a seventh NFET, the seventh NFET having a gate, source, and drain;

c) a eighth NFET, the eighth NFET having a gate, source, and drain;

d) wherein the output of the NOR logic gate is connected to the gate of the seventh NFET and the gate of the eighth NFET;

e) wherein the source of the seventh NFET and the source of the eighth NFET are connected to GND;

f) wherein the set of inputs of the NOR logic gate is the input to the first control circuit;

g) wherein the drain of the seventh NFET is the first output of the first control circuit;

h) wherein the drain of the eighth NFET is the second output of the first control circuit.

* * * * *